United States Patent
Xu et al.

(10) Patent No.: US 9,778,562 B2
(45) Date of Patent: Oct. 3, 2017

(54) POROUS TEMPLATE AND IMPRINTING STACK FOR NANO-IMPRINT LITHOGRAPHY

(75) Inventors: Frank Y. Xu, Round Rock, TX (US); Weijun Liu, Cedar Park, TX (US); Edward Brian Fletcher, Austin, TX (US); Sidlgata V. Sreenivasan, Austin, TX (US); Byung Jin Choi, Austin, TX (US); Niyaz Khusnatdinov, Round Rock, TX (US); Anshuman Cherala, Austin, TX (US); Kosta S. Selinidis, Austin, TX (US)

(73) Assignee: Canon Nanotechnologies, Inc., Austin, TX (US)

(*) Notice: Subject to any disclaimer, the term of this patent is extended or adjusted under 35 U.S.C. 154(b) by 129 days.

(21) Appl. No.: 12/275,998

(22) Filed: Nov. 21, 2008

(65) Prior Publication Data
US 2009/0140458 A1 Jun. 4, 2009

Related U.S. Application Data

(60) Provisional application No. 60/991,954, filed on Dec. 3, 2007, provisional application No. 60/989,681, filed on Nov. 21, 2007.

(51) Int. Cl.
G03F 7/00 (2006.01)
B82Y 10/00 (2011.01)
B82Y 40/00 (2011.01)

(52) U.S. Cl.
CPC ............ *G03F 7/0002* (2013.01); *B82Y 10/00* (2013.01); *B82Y 40/00* (2013.01); *Y10T 428/249978* (2015.04)

(58) Field of Classification Search
CPC .................................................. G03F 7/0002
(Continued)

(56) References Cited

U.S. PATENT DOCUMENTS 4,714,810 A 12/1987 Sirkis
5,028,511 A 7/1991 Choi
(Continued)

FOREIGN PATENT DOCUMENTS

EP 2221664 8/2010
KR 20070031858 A 8/2010
(Continued)

OTHER PUBLICATIONS

PCT/US2008/12990 International Search Report, dated Feb. 25, 2009, pp. 1-7.
(Continued)

*Primary Examiner* — Larry Thrower
(74) *Attorney, Agent, or Firm* — Fish & Richardson P.C.; Heather L. Flanagan

(57) ABSTRACT

An imprint lithography template or imprinting stack includes a porous material defining a multiplicity of pores with an average pore size of at least about 0.4 nm. A porosity of the porous material is at least about 10%. The porous template, the porous imprinting stack, or both may be used in an imprint lithography process to facilitate diffusion of gas trapped between the template and the imprinting stack into the template, the imprinting stack or both, such that polymerizable material between the imprinting stack and the template rapidly forms a substantially continuous layer between the imprinting stack and the template.

20 Claims, 7 Drawing Sheets

(58) Field of Classification Search
USPC ........ 264/319, 48, 270.1; 216/48; 430/270.1
See application file for complete search history.

(56) References Cited

U.S. PATENT DOCUMENTS

| | | |
|---|---|---|
| 5,395,954 A | 3/1995 | Soria et al. |
| 5,620,777 A | 4/1997 | Goto et al. |
| 5,753,781 A | 5/1998 | Oxman et al. |
| 5,792,550 A | 8/1998 | Phillips et al. |
| 5,895,263 A | 4/1999 | Carter et al. |
| 5,928,767 A | 7/1999 | Gebhardt et al. |
| 6,200,736 B1 | 3/2001 | Tan |
| 6,271,273 B1 | 8/2001 | You et al. |
| 6,329,017 B1 | 12/2001 | Liu et al. |
| 6,334,960 B1 | 1/2002 | Willson et al. |
| 6,435,948 B1 | 8/2002 | Molnar |
| 6,465,365 B1 | 10/2002 | Annapragada |
| 6,483,174 B1 | 11/2002 | Crafts et al. |
| 6,497,961 B2 | 12/2002 | Kang et al. |
| 6,573,131 B2 | 6/2003 | Yan et al. |
| 6,592,764 B1 | 7/2003 | Stucky et al. |
| 6,660,245 B1 | 12/2003 | Gaynor et al. |
| 6,790,790 B1 | 9/2004 | Lyons et al. |
| 6,873,087 B1 | 3/2005 | Choi et al. |
| 6,932,934 B2 | 8/2005 | Choi et al. |
| 6,936,194 B2 | 8/2005 | Watts |
| 6,957,608 B1 | 10/2005 | Hubert et al. |
| 6,960,327 B2 | 11/2005 | Navrotsky et al. |
| 7,090,716 B2 | 8/2006 | McMakin et al. |
| 7,098,149 B2 | 8/2006 | Lukas et al. |
| 7,138,362 B2 | 11/2006 | Abe et al. |
| 7,141,188 B2 | 11/2006 | Li et al. |
| 7,157,036 B2 | 1/2007 | Choi et al. |
| 7,160,949 B2 | 1/2007 | Ota et al. |
| 7,229,273 B2 | 6/2007 | Bailey et al. |
| 7,253,130 B2 | 8/2007 | Chiang et al. |
| 7,303,989 B2 | 12/2007 | Boyanov et al. |
| 7,307,118 B2 | 12/2007 | Xu et al. |
| 7,314,792 B2 | 1/2008 | Kim et al. |
| 7,365,375 B2 | 4/2008 | Goodner et al. |
| 7,384,622 B2 | 6/2008 | Hata et al. |
| 7,405,459 B2 | 7/2008 | Ogihara et al. |
| 7,422,774 B2 | 9/2008 | Zheng et al. |
| 7,422,776 B2 | 9/2008 | Yim et al. |
| 7,629,272 B2 | 12/2009 | Waldfried et al. |
| 7,737,021 B1 | 6/2010 | Dakshina-Murthy et al. |
| 7,819,652 B2 | 10/2010 | Lee et al. |
| 2002/0134995 A1 | 9/2002 | Yan et al. |
| 2003/0054115 A1 | 3/2003 | Albano et al. |
| 2003/0127002 A1 | 7/2003 | Hougham et al. |
| 2003/0224144 A1 | 12/2003 | King et al. |
| 2004/0065252 A1 | 4/2004 | Sreenivasan et al. |
| 2004/0065976 A1 | 4/2004 | Sreenivasan et al. |
| 2004/0102032 A1 | 5/2004 | Kloster et al. |
| 2004/0124566 A1 | 7/2004 | Sreenivasan et al. |
| 2004/0188381 A1 | 9/2004 | Sreenivasan et al. |
| 2004/0211754 A1 | 10/2004 | Sreenivasan |
| 2005/0100830 A1 | 5/2005 | Xu et al. |
| 2005/0187339 A1 | 8/2005 | Xu et al. |
| 2005/0192421 A1 | 9/2005 | Xu et al. |
| 2005/0230882 A1 | 10/2005 | Watts et al. |
| 2005/0238967 A1 | 10/2005 | Rogers et al. |
| 2006/0024976 A1 | 2/2006 | Waldfried et al. |
| 2006/0081557 A1* | 4/2006 | Xu et al. .................. 216/48 |
| 2006/0148370 A1 | 7/2006 | Kadono et al. |
| 2007/0117408 A1 | 5/2007 | Nguyen et al. |
| 2007/0123059 A1 | 5/2007 | Haverty et al. |
| 2007/0160639 A1 | 7/2007 | Pantelidis et al. |
| 2007/0190777 A1 | 8/2007 | Jiang et al. |
| 2008/0000373 A1 | 1/2008 | Petrucci-Samija |
| 2008/0055581 A1 | 3/2008 | Rogers et al. |
| 2008/0143015 A1 | 6/2008 | Lee et al. |
| 2008/0160129 A1 | 7/2008 | Resnick et al. |
| 2008/0197513 A1 | 8/2008 | Restaino et al. |
| 2008/0199632 A1 | 8/2008 | Wolden et al. |
| 2009/0087506 A1 | 4/2009 | Hasegawa et al. |
| 2009/0266418 A1 | 10/2009 | Hu et al. |
| 2010/0072671 A1 | 3/2010 | Schmid et al. |
| 2010/0084376 A1* | 4/2010 | Khusnatdinov ........ B82Y 10/00 216/39 |
| 2010/0104852 A1* | 4/2010 | Fletcher et al. ........... 428/315.5 |
| 2010/0108639 A1 | 5/2010 | Kasono |
| 2010/0109201 A1 | 5/2010 | Fletcher et al. |
| 2010/0109203 A1 | 5/2010 | Chen et al. |
| 2011/0183027 A1 | 7/2011 | Miller et al. |
| 2011/0189329 A1 | 8/2011 | Miller et al. |

FOREIGN PATENT DOCUMENTS

| | | |
|---|---|---|
| WO | WO/97/06012 | 2/1997 |
| WO | WO/00/02090 | 1/2000 |
| WO | WO/2005/036681 | 4/2005 |
| WO | WO 2006/044690 | 4/2006 |
| WO | WO/2008/053418 | 5/2008 |
| WO | 2008126313 | 10/2008 |
| WO | 2009067241 A1 | 5/2009 |
| WO | 2010047821 A1 | 4/2010 |
| WO | 2011004991 | 1/2011 |

OTHER PUBLICATIONS

Chen et al., "Effect of Trimethylsilylation on the Film Stress of Mesoporous Silica Ultralow-k Film Stacks," Electrochem. Solid-State Lett., 9:6 (2006) G215-G218.

Breck, Zeolite Molecular Sieves: Structure, Chemistry, and Use; John Wiley and Sons, New York, New York, 1974 (p. 637).

Shackelford, "Gas solubility in glasses—principles and structural implications," J. Non-Cryst. Solids 253 (1999) 231-241.

Boiko, "Migration Paths of Helium in α-Quartz and Vitreous Silica from Molecular Dynamics Data," Glass Physics and Chemistry, 29:1 (2003) 42-48.

Zhang et al., "Highly Porous Polyhedral Silsesquixoane Polymers. Synthesis and Characterization," J. Am. Chem. Soc., 120 (1998) 8380-8391.

Peng et al., "Analysis of the gas transport performance through PDMS/PS composite membranes using the resistances-in-series model," J. Membrane Sci. 222 (2003) 225-234.

Prakash et al., "Small volume PCR in PDMS biochips with integrated fluid control and vapor barrier," Sensors and Actuators B 113 (2006) 398-409.

Yoda et al., "Properties of High-Performance Porous SiOC Low-k Film Fabricated Using Electron-Beam Curing" Jpn. J. Appl. Phys. 44 (2005) 3872-3878.

Kulkarni et al., "Electrical and structural characteristics of chromium thin films deposited on glass and alumina substrates," Thin Solid Films 301 (1977): 17-22.

Mitra et al., "Synthesis and evaluation of pure-silica-zeolite BEA as low dielectric constant material for microprocessors," Ind. Eng. Chem. Res., 43:12 (2004) 2946-2949.

Bushan et al., "Friction and wear studies of silicon in sliding contact with thin film magnetic rigid disks," J. Mater. Res. 9 (1993) 1611-1628.

Li et al., "Mechanical Characterization of micro/nanoscale structures for MEMS/NEMS applications using nanoindentation techniques," Ultramicroscopy 97 (2003)481-494.

Devine et al., "On the structure of low-temperature PECVD silicon dioxide films," J. Electron. Mater. 19 (1990) 1299-1301.

Cao et al., "Density change and viscous flow during structural relaxation of plasma-enhanced chemical-vapor-deposited silicon oxide films," J. Appl. Phys. 96 (2004) 4273-4280.

Xia et al., "Sub-10-nm Self-Enclosed Self-Limited Nanofluidic Channel Arrays," Nano. Lett. 8:11 (2008) 3830-3833.

Johnson et al. "Effect of calcination and polycrystallization on mechanical properties of nanoporous MFI zeolites," Materials Science and Engineering A 456(2007) 58-63.

Dong et al. "Template-removal-associated microstructural development of porous-ceramic-supported MFI zeolite membranes," Microporous and Mesoporous Materials 34 (2000) 241-253.

(56) References Cited

OTHER PUBLICATIONS

Tang et al., "Microwave synthesis of MFI-type zeolite membranes by seeded secondary growth without the use of organic structure directing agents," Microporous and Mesoporous Materials 118:1-3 (2009) 224-231.
Thoma et al., "Vapor phase transport synthesis of zeolites from sol-gel precursors," Microporous and Mesoporous Materials 41 (2000) 295-305.
McLeary et al., "Zeolite-based films, membranes, and membrane reactors: progress and prospects," Microporous and Mesoporous Materials 90 (2006) 198-200.
Motuzas et al., "Ultra-rapid production of MFI membranes by coupling microwave-assisted synthesis with either ozone or calcination treatment," Microporous and Mesoporous Materials, 99:1-2 (2007) 197-205.
Kanezashi et al., "Template-free synthesis of MFI-type zeolite membranes: Permeation characteristics and thermal stability improvement of membrane structure," Journal of Membrane Science, 286: 1-2 (2006) 213-222.
Li et al., "Microwave synthesis of zeolite membranes: A review," Journal of Membrane Science, 316:1-2 (2008) 3-17.
Gualtieri et al., "The influence of heating rate on template removal in silicalite-1: An in-situ HT-XRPD study," Microporous and Mesoporous Materials 89:1-3 (2006) 1-8.
Li et al., "Effects of crystallinity in spin-on pure-silica-zeolite MFI low-dielectric-constant films," Advanced Functional Materials. 14:10 (2004) 1019-1024.
Liu et al., "Nanoporous zeolite thin film-based fiber intrinsic Fabry-Perot interferometric sensor for detection of dissolved organics in water," Sensors 6:8 (2006), 835-847.
Golden et al., "Designing Porous low-k Dielectrics," Semiconductor International, May 2001.
Levy et al., "A comparative study of plasma enhanced chemically vapor deposited Si—O—H and Si—N—C—H films using the environmentally benign precursor diethylsilane," Mater. Lett. 54 (2002) 1299-1301.

Stoney, "The tension of metallic films deposited by electrolysis," Proc. R. Soc. London, Ser. A 82 (1909) 172.
Padovani et al., "Chemically bonded porogens in methylsilsesquioxane: I. Structure and bonding," Journal of the Electrochemical Society, 149 (12) F161-F170 (2002).
Wolf et al., "Silicon Processing for the VLSI Era, vol. 1—Process Technology," pp. 407-413, Jan. 1, 1986.
Pham et al., "Direct Spray Coating of Photoresist," The 16th European Conference on Solid State Transducers, Sep. 16-18, 2002, Czech Republic.
International Search Report for Application No. PCT/US05/37063 dated Jun. 14, 2006, 2 pages.
International Search Report for Application No. PCT/US09/005775 dated Apr. 8, 2010, 12 pages.
Kim et al., "Fabrication of three-dimensional microstructures by soft molding," Appl. Phys. Lett., vol. 79, No. 14, Oct. 1, 2001, pp. 2285-2287.
Zhichao Song, "Study of demolding process in thermal imprint lithography via numerical simulation and experimental approaches," A Thesis submitted to graduate faculty of the Louisiana State University and Agricultural and Mechanical College in partial fulfillment of the requirements for the degree of Master of Science in Mechanical Engineering in The Department of Mechanical Engineering, Dec. 2007, 132 pages.
Dupont Tenjin Films, Melinex 561 Datasheet, retrieved online Dec. 3, 2012, http://www.dupontteijinfilms.com/FilmEnterprise/Datasheet.asp?ID=130&Version=US 1 page.
Thiele, International Search Report for Application No. PCT/US2011/023193, dated Aug. 19, 2011.
International Search Report for Application No. PCT/US2011/022583, dated Aug. 10, 2011, 4 pages.
Xia et al., Soft Lithography, Angew. Chem. Int. Ed., ISSN 1433-7851; vol. 37, Jan. 1, 1998, pp. 551-575.
Dupont Zonyl UR, www.dupont.com/zonyl/pdf/UR.pdf; Jun. 21, 2003, pp. 1-2.
Parsettensite mineral data, www.webmineral.com/data/parsettensite.shtml; Aug. 17, 2001, pp. 1-5.

* cited by examiner

POROUS TEMPLATE AND IMPRINTING STACK FOR NANO-IMPRINT LITHOGRAPHY

CROSS-REFERENCE TO RELATED APPLICATIONS

This application claims the benefit under 35 U.S.C. §119 (e)(1) of U.S. provisional application 60/989,681, filed Nov. 21, 2007, and U.S. provisional application 60/991,954 filed Dec. 3, 2007, both of which are hereby incorporated by reference herein.

STATEMENT REGARDING FEDERALLY SPONSORED RESEARCH OR DEVELOPMENT

The United States government has a paid-up license in this invention and the right in limited circumstance to require the patent owner to license others on reasonable terms as provided by the terms of NIST ATP AWARD 70NANB4H3012.

BACKGROUND

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate, therefore nano-fabrication becomes increasingly important. Nano-fabrication provides greater process control while allowing continued reduction of the minimum feature dimensions of the structures formed. Other areas of development in which nano-fabrication has been employed include biotechnology, optical technology, mechanical systems, and the like.

SUMMARY

In one aspect, an imprint lithography template or imprinting stack includes a porous material defining a multiplicity of pores with an average pore size of at least about 0.4 nm. A porosity of the porous material is at least about 10%.

In some implementations, the average pore size is at least about 0.5 nm or at least about 1.0 nm. The porosity of the porous material may be at least about 20%. In some cases, the porous material is an organosilicate low-k material. The relative porosity of the porous material with respect to fused silica may be at least about 20%. In some cases, the porous material has a Young's modulus of at least about 2 GPa, at least about 5 GPa, or at least about 10 GPa.

In some template implementations, the porous material is positioned between a base layer and a cap layer. The base layer may include fused silica. In some cases, the base layer includes recesses, and the porous material is positioned in the recesses. In some cases, the cap layer includes $SiO_x$, with $1 \leq x \leq 2$. A thickness of the cap layer maybe less than about 100 nm, less than about 50 nm, or less than about 20 nm. Protrusions may extend from the cap layer.

In some imprinting stack implementations, the porous material is positioned between a substrate and a cap layer. The substrate may include silicon.

In another aspect, forming an imprint lithography template includes forming a porous layer on a base layer, and forming a cap layer on the porous layer. In another aspect, forming an imprint lithography template includes forming a multiplicity of recesses in a base, depositing a porous material in the recesses, and forming a cap layer on the base layer. In another aspect, forming an imprint lithography stack includes forming a porous layer on a substrate, and forming a cap layer on the porous layer. The porous layer defines a multiplicity of pores with an average pore size of at least about 0.4 nm, and the porosity of the porous layer is at least about 10%.

In another aspect, an imprint lithography method includes applying drops of a polymerizable material to an imprinting stack, contacting the polymerizable material with a template, solidifying the polymerizable material, and separating the template from the solidified material. In some cases, the template includes a porous material. In some cases, the imprinting stack includes a porous material. In some cases, the template and the imprinting stack both include a porous material. The porous material defines a multiplicity of pores with an average pore size of at least about 0.4 nm, and the porosity of the porous material is at least about 10%.

In another aspect, an imprint lithography method includes dispensing drops of a polymerizable material on a surface of an imprinting stack, contacting the polymerizable material with a template, and allowing the polymerizable material to spread to form a substantially continuous layer on the surface of the imprinting stack. The template, the imprinting stack, or both may include a porous material defining a multiplicity of pores with an average pore size of at least about 0.4 nm, and the porosity of the porous material is at least about 10%. Spreading of the polymerizable material to form the substantially continuous layer occurs in about 80% or less, about 50% or less, or about 20% less of the time required for a similar distribution of a similar polymerizable material to form a substantially continuous layer between a second template and a second imprinting stack, where the second template and the second imprinting stack have an average pore size of less than about 0.4 nm.

BRIEF DESCRIPTION OF DRAWINGS

So that the present invention may be understood in more detail, a description of embodiments of the invention is provided with reference to the embodiments illustrated in the appended drawings. It is to be noted, however, that the appended drawings illustrate only typical embodiments of the invention, and are therefore not to be considered limiting of the scope.

DETAILED DESCRIPTION

An exemplary nano-fabrication technique in use today is commonly referred to as imprint lithography. Exemplary imprint lithography processes are described in detail in numerous publications, such as U.S. Patent Application Publication No. 2004/0065976, U.S. Patent Application Publication No. 2004/0065252, and U.S. Pat. No. 6,936,194, all of which are hereby incorporated by reference herein.

An imprint lithography technique disclosed in each of the aforementioned U.S. patent application publications and patent includes formation of a relief pattern in a formable (polymerizable) layer and transferring a pattern corresponding to the relief pattern into an underlying substrate. The substrate may be coupled to a motion stage to facilitate positioning for the patterning process. The patterning process uses a template spaced apart from the substrate and the formable liquid applied between the template and the substrate. The formable liquid is solidified to form a rigid layer that has a pattern conforming to a shape of the surface of the template that contacts the formable liquid. After solidification, the template is separated from the rigid layer such that the template and the substrate are spaced apart. The substrate and the solidified layer are then subjected to additional processes to transfer a relief image into the substrate that corresponds to the pattern in the solidified layer.

Figure 1:
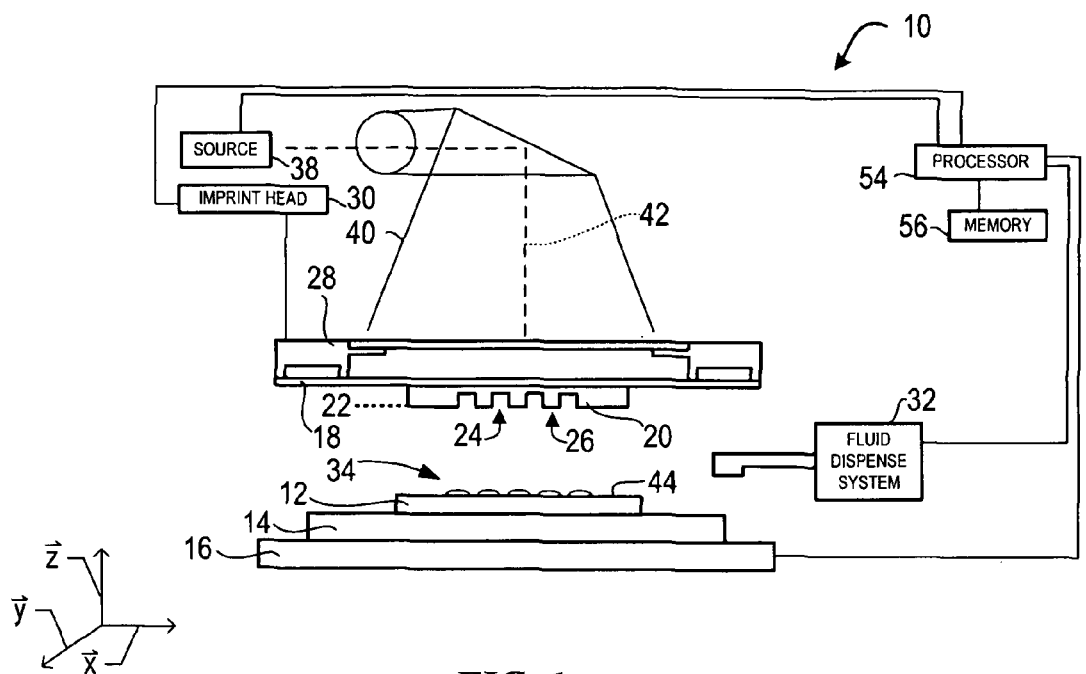
FIG. 1 illustrates a simplified side view of a lithographic system.

Referring to FIG. 1, illustrated therein is a lithographic system 10 used to form a relief pattern on substrate 12. An imprint lithography stack may include substrate 12 and one or more layers (e.g., an adhesion layer) adhered to the substrate. Substrate 12 may be coupled to substrate chuck 14. As illustrated, substrate chuck 14 is a vacuum chuck. Substrate chuck 14, however, may be any chuck including, but not limited to, vacuum, pin-type, groove-type, electro-magnetic, and the like, or any combination thereof. Exemplary chucks are described in U.S. Pat. No. 6,873,087, which is hereby incorporated by reference herein.

Substrate 12 and substrate chuck 14 may be further supported by stage 16. Stage 16 may provide motion about the x-, y-, and z-axes. Stage 16, substrate 12, and substrate chuck 14 may also be positioned on a base (not shown).

Spaced-apart from substrate 12 is a template 18. Template 18 may include a mesa 20 extending therefrom towards substrate 12, mesa 20 having a patterning surface 22 thereon. Further, mesa 20 may be referred to as mold 20. Template 18 and/or mold 20 may be formed from such materials including, but not limited to, fused-silica, quartz, silicon, organic polymers, siloxane polymers, borosilicate glass, fluorocarbon polymers, metal, hardened sapphire, and the like, or any combination thereof. As illustrated, patterning surface 22 comprises features defined by a plurality of spaced-apart recesses 24 and/or protrusions 26, though embodiments of the present invention are not limited to such configurations. Patterning surface 22 may define any original pattern that forms the basis of a pattern to be formed on substrate 12.

Template 18 may be coupled to chuck 28. Chuck 28 may be configured as, but not limited to, vacuum, pin-type, groove-type, electromagnetic, and/or other similar chuck types. Exemplary chucks are further described in U.S. Pat. No. 6,873,087, which is hereby incorporated by reference herein. Further, chuck 28 may be coupled to imprint head 30 such that chuck 28 and/or imprint head 30 may be configured to facilitate movement of template 18.

System 10 may further comprise a fluid dispense system 32. Fluid dispense system 32 may be used to deposit polymerizable material 34 on substrate 12. Polymerizable material 34 may be positioned upon substrate 12 using techniques such as drop dispense, spin-coating, dip coating, chemical vapor deposition (CVD), physical vapor deposition (PVD), thin film deposition, thick film deposition, and the like, or any combination thereof. Polymerizable material 34 (e.g., imprint resist) may be disposed upon substrate 12 before and/or after a desired volume is defined between mold 20 and substrate 12 depending on design considerations. Polymerizable material 34 may include components as described in U.S. Pat. No. 7,157,036 and U.S. Patent Application Publication No. 2005/0187339, both of which are hereby incorporated by reference herein.

Figure 2:
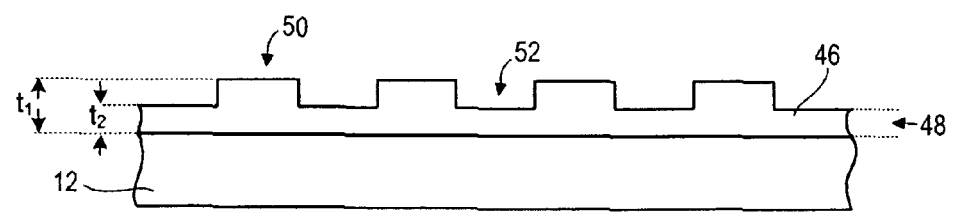
FIG. 2 illustrates a simplified side view of the substrate shown in FIG. 1 having a patterned layer positioned thereon.

Referring to FIGS. 1 and 2, system 10 may further comprise an energy source 38 coupled to direct energy 40 along path 42. Imprint head 30 and stage 16 may be configured to position template 18 and substrate 12 in superimposition with path 42. System 10 may be regulated by a processor 54 in communication with stage 16, imprint head 30, fluid dispense system 32, source 38, or any combination thereof, and may operate on a computer readable program stored in memory 56.

Either imprint head 30, stage 16, or both may alter a distance between mold 20 and substrate 12 to define a desired volume therebetween that is substantially filled by polymerizable material 34. For example, imprint head 30 may apply a force to template 18 such that mold 20 contacts polymerizable material 34. After the desired volume is substantially filled with polymerizable material 34, source 38 produces energy 40, e.g., broadband ultraviolet radiation, causing polymerizable material 34 to solidify and/or cross-link conforming to shape of a surface 44 of substrate 12 and patterning surface 22, defining a patterned layer 46 on substrate 12. Patterned layer 46 may include a residual layer 48 and a plurality of features shown as protrusions 50 and recessions 52, with protrusions 50 having a thickness $t_1$ and residual layer 48 having a thickness $t_2$.

The above-described system and process may be further implemented in imprint lithography processes and systems referred to in U.S. Pat. No. 6,932,934, U.S. Patent Application Publication No. 2004/0124566, U.S. Patent Application Publication No. 2004/0188381, and U.S. Patent Application Publication No. 2004/0211754, each of which is hereby incorporated by reference herein.

In nano-imprint processes in which polymerizable material is applied to a substrate by drop dispense or spin coating methods, gases may be trapped inside recesses in the template after the template contacts the polymerizable material. In nano-imprint processes in which polymerizable material is applied to a substrate by drop dispense methods, gases may also be trapped between drops of polymerizable material or imprint resist dispensed on a substrate or on an imprinting stack. That is, gases may be trapped in interstitial regions between drops as the drops spread.

Gas escape and dissolution rates may limit the rate at which the polymerizable material is able to form a continuous layer on the substrate (or imprinting stack) or the rate at which the polymerizable material is able to fill template features after the template contacts the polymerizable material, thereby limiting throughput in nano-imprint processes. For example, a substrate or a template may be substantially impermeable to a gas trapped between the substrate and the template. In some cases, a polymeric layer adhered to the substrate or the template may become saturated with gas, such that gas between the imprinting stack and the template is substantially unable to enter the saturated polymeric layer, and remains trapped between the substrate or imprinting stack and the template. Gas that remains trapped between the substrate or the imprinting stack and the template may cause filling defects in the patterned layer.

In an imprint lithography process, gas trapped between the substrate/imprinting stack and the template may escape through the polymerizable material, the substrate/imprinting stack, the template, or any combination thereof. The amount of gas that escapes through any medium may be influenced by the contact area between the trapped gas and the medium. The contact area between the trapped gas and the polymerizable material may be less than the contact area between the trapped gas and the substrate/imprinting stack and less than the contact area between the trapped gas and the template. For example, a thickness of the polymerizable material on a substrate/imprinting stack may be less than about 1 μm, or less than about 100 nm. In some cases, a polymerizable material may absorb enough gas to become saturated with the gas before imprinting, such that trapped gas is substantially unable to enter the polymerizable material. In contrast, the contact area between the trapped gas and the substrate or imprinting stack, or the contact area between the trapped gas and the template, may be relatively large.

In some cases, the substrate/imprinting stack or template may include a porous material defining a multiplicity of pores with an average pore size and pore density or relative porosity selected to facilitate diffusion of a gas into the substrate/imprinting stack or the template, respectively. In certain cases, the substrate/imprinting stack or template may include one or more layers or regions of a porous material designed to facilitate transport of gases trapped between the substrate/imprinting stack and the template in a direction away from the polymerizable material between the substrate/imprinting stack and substrate and toward the substrate/imprinting stack or the template, respectively.

The gas permeability of a medium may be expressed as $P=D \times S$, in which P is the permeability, D is the diffusion coefficient, and S is the solubility. In a gas transport process, a gas adsorbs onto a surface of the medium, and a concentration gradient is established within the medium. The concentration gradient may serve as the driving force for diffusion of gas through the medium. Gas solubility and the diffusion coefficient may vary based on, for example, packing density of the medium. Adjusting a packing density of the medium may alter the diffusion coefficient and hence the permeability of the medium.

A gas may be thought of as having an associated kinetic diameter. The kinetic diameter provides an idea of the size of the gas atoms or molecules for gas transport properties. D. W. Breck, Zeolite Molecular Sieves—Structure, Chemistry, and Use, John Wiley & Sons, New York, 1974, p. 636, which is hereby incorporated by reference) herein, lists the kinetic diameter for helium (0.256 nm), argon (0.341 nm), oxygen (0.346 nm), nitrogen (0.364 nm), and other common gases.

In some imprint lithography processes, a helium purge is used to substantially replace air between the template and the substrate or imprinting stack with helium gas. To simplify the comparison between a helium environment and an air environment in an imprint lithography process, the polar interaction between oxygen in air and silica may be disregarded by modeling air as pure argon. Both helium and argon are inert gases, and argon has a kinetic diameter similar to that of oxygen. Unlike oxygen, however, helium and argon do not interact chemically with fused silica or quartz (e.g., in a template or substrate).

Internal cavities (solubility sites) and structural channels connecting the solubility sites allow a gas to permeate through a medium. The gas may be retained in the solubility sites. The size of the internal cavities and the channel diameter relative to the size (or kinetic diameter) of the gas influence the rate at which the gas permeates the medium.

The sizes of individual interstitial solubility sites of fused silica have been shown to follow a log-normal distribution by J. F. Shackelford in J. Non-Cryst. Solids 253, 1999, 23, which is hereby incorporated by reference herein. As indicated by the interstitial diameter distribution (mode=0.181 nm; mean=0.196 nm) and the kinetic diameter of helium and argon, the number of fused silica solubility sites available to helium exceeds the number of solubility sites available to argon. The total number of interstitial sites is estimated to be $2.2 \times 10^{28}$ per m$^3$, with $2.3 \times 10^{27}$ helium solubility sites per m$^3$ and $1.1 \times 10^{26}$ argon solubility sites per m$^3$. The average distance between solubility sites for helium is considered to be 0.94 nm, while the average distance between solubility sites for argon is considered to be 2.6 nm. The structural channels connecting these solubility sites are thought to be similar to the helical arrangement of 6-member Si—O rings, with a diameter of about 0.3 nm. Table 1 summarizes some parameters affecting helium and argon permeability in fused silica.

TABLE 1

|  | Helium | Argon |
| --- | --- | --- |
| Kinetic Diameter (nm) | 0.256 | 0.341 |
| Solubility Site Density (m$^{-3}$) | $2.3 \times 10^{27}$ | $1.1 \times 10^{26}$ |
| Distant Between Solubility Sites (nm) | 0.94 | 2.6 |
| Structural Channel Diameter Connecting Solubility Sites (nm) | ~0.3 | ~0.3 |

Boiko (G. G. Boiko, etc., Glass Physics and Chemistry, Vol. 29, No. 1, 2003, pp. 42-48, which is hereby incorporated by reference herein) describes behavior of helium in amorphous or vitreous silica. Within a solubility site, the helium atom vibrates at an amplitude allowed by the interstitial volume. The atom passes from interstice to interstice through channels, which may be smaller in diameter than the interstices.

The parameters listed in Table 1 indicate that argon permeability in fused silica may be very low or negligible at room temperature (i.e., the kinetic diameter of argon exceeds the fused silica channel size). Since the kinetic diameters of oxygen and nitrogen are larger than the kinetic diameter of argon, air may be substantially unable to permeate fused silica. On the other hand, helium may diffuse into and permeate fused silica. Thus, when a helium environment is used rather than ambient air for a nano-imprint process, helium trapped between the template and the substrate or imprinting stack may be able to permeate a fused silica template.

Figure 3:
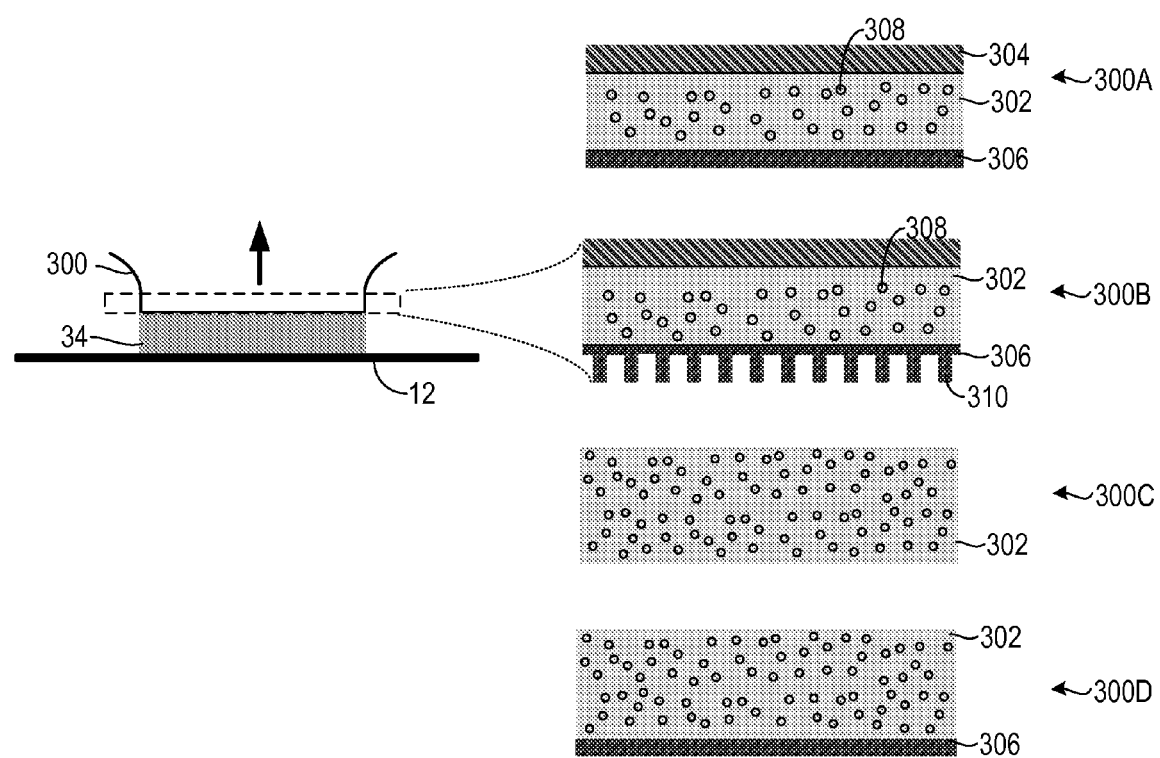
FIG. 3 illustrates porous templates.

FIG. 3 is a side view of polymerizable material 34 between substrate 12 and porous template 300, along with enlarged cross-sectional views of various porous template embodiments for use in nano-imprint lithography. The arrow indicates the direction of gas transport into template 300.

Template 300A includes a porous layer 302 between base layer 304 and cap layer 306. Porous layer 302 may be formed by chemical vapor deposition (CVD), spin-coating, thermal growth methods, or the like on base layer 304. A thickness of porous layer 302 may be at least about 10 nm. For example, a thickness of porous layer 302 may be in a range of about 10 nm to about 100 μm, or in a range of about 100 nm to about 10 μm. In some cases, a thicker porous layer 302 may provide higher effective permeability, without significantly reducing performance related to, for example, UV transparency, thermal expansion, etc.

Porous layer 302 may be made from materials including, but not limited to anodized a-alumina; organo-silane, organo-silica, or organosilicate materials; organic polymers; inorganic polymers, and any combination thereof. In some embodiments, the porous material may be low-k, porous low-k, or ultra-low-k dielectric film, such as spin-on glass (SOG) used in electronic and semiconductor applications. The porous material may be selected to withstand repeated use in nano-imprint lithography processes, including Piranha reclaim processes. Adhesion of the porous layer 302 to the base layer 304 and the cap layer 306 may be, for example, at least about three times the force required to separate the template from the patterned layer formed in an imprint lithography process. In some embodiments, the porous material may be substantially transparent to UV radiation. A tensile modulus of the porous material may be, for example, at least about 2 GPa, at least about 5 GPa, or at least about 10 GPa.

By varying the process conditions and materials, porous layers with different pore size and pore density (e.g., porosity or relative porosity) may be produced. In some cases, for example, ion bombardment may be used to form pores in a material. Porous layer 302 may have pores 308 with a larger pore size and a greater porosity than fused silica. As used herein, "porosity" refers to the fraction, as a percent of total volume, occupied by channels and open spaces in a solid. The porosity of porous layer 302 may range from about 0.1% to about 60%, or from about 5% to about 45%. In some cases, the porosity of porous layer 302 may be at least about 10% or at least about 20%. The relative porosity of similar materials may be defined as a relative difference in density of the materials. For example, a relative porosity of SOG (density $\rho_{SOG}$=1.4 g/cm$^3$) with respect to fused silica (density $\rho_{fused\ silica}$=2.2 g/cm$^3$) may be calculated as 100%× ($\rho_{fused\ silica}$-$\rho_{SOG}$)/$\rho_{fused\ silica}$, or 36%. Fused silica may be used as a reference material for other materials including oxygen-silicon bonds. In some embodiments, a relative porosity of a porous material including oxygen-silicon bonds with respect to fused silica is at least about 10%, at least about 20%, or at least about 30%.

Sizes of the pores in a porous material may be well-controlled (e.g., substantially uniform, or with a desired distribution). In some cases, a pore size or average pore size is less than about 10 nm, less than about 3 nm, or less than about 1 nm. In some cases, the pore size or average pore size is at least about 0.4 nm, at least about 0.5 nm, or larger. That is, the pore size or average pore size may be large enough to provide a sufficient number of solubility sites for a gas, such that the gas, when trapped between the substrate/imprinting stack and the template 300A, is able to diffuse into porous layer 302 of the template.

Silsesquioxane polymers are exemplary porous materials. In "Highly Porous Polyhedral Silsesquioxane Polymers. Synthesis and Characterization," J. Am. Chem. Soc., 1998, 120, 8380-8391, which is hereby incorporated by reference herein, Zhang et al. describe small intracube pores and larger intercube pores in silsesquioxane polymers. The intracube pores are approximated by a 0.3-0.4 nm sphere. The intercube pores are oblong with a 0.5-0.6 nm diameter and a length of 1.0-1.2 nm. As discussed herein, pores with a diameter of at least about 0.4 nm, such as silsesquioxane polymers, are believed to provide solubility sites of a size and shape suitable to absorb gases with a kinetic diameter smaller than the dimensions of the solubility sites. In some cases, the structure of the solubility sites of a porous material may allow the absorbed gas to be substantially held in the solubility sites, rather than diffusing out of the material.

Porogens may be added to material used to form porous layer 302 to increase the porosity and pore size of the porous layer. Porogens include, for example, organic compounds that may be vaporized, such as norbornene, α-terpinene, polyethylene oxide, and polyethylene oxide/polypropylene oxide copolymer, and the like, and any combination thereof. Porogens may be, for example, linear or star-shaped. Porogens and process conditions may be selected to form a microporous low-k porous layer, for example, with an average pore diameter of less than about 2 nm, thereby increasing the number of solubility sites for a range of gases. In addition, the introduction of porogens and the increased porosity may enlarge the structure channels connecting gas solubility sites. For pore sizes of about 0.4 nm or greater, helium permeability of a low-k film may exceed helium permeability of vitreous fused silica.

Base layer 304 and cap layer 306 may be made of the same or different material. In some embodiments, base layer 304 may be fused silica and cap layer 306 may include $SiO_x$, with 1≤x≤2, grown through a vapor deposition method. A thickness and composition of cap layer 306 may be chosen to provide mechanical strength and selected surface properties, as well as permeability to gases that may be trapped between a substrate/imprinting stack and a template in an imprint lithography process. In some embodiments, a thickness of cap layer 306 is less than about 100 nm, less than about 50 nm, or less than about 20 nm. In an example, cap layer 306 is about 10 nm thick. Cap layer 306 may be formed by material selected to achieve desirable wetting and release performance during an imprint lithography process. Cap layer 306 may also inhibit penetration of polymerizable material 34 into the porous layer while allowing gas to diffuse through the cap layer and into the porous layer 302.

For a multi-layer film, effective permeability may be calculated from a resistance model, such as an analog of an electric circuit described by F. Peng, et al. in *J. Membrane Sci.* 222 (2003) 225-234 and A. Ranjit Prakash et al. in *Sensors and Actuators* B 113 (2006) 398-409, which are both hereby incorporated by reference herein. The resistance of a material to the permeation of a vapor is defined as the permeance resistance, $R_p$. For a two-layer composite film with layer thicknesses $l_1$ and $l_2$, and corresponding permeabilities $P_1$ and $P_2$, permeance resistance may be defined as:

$$R_p = \frac{\Delta p}{J} = \frac{1}{(P/l)A} \tag{1}$$

in which $\Delta p$ is the pressure difference across the film, J is the flux, and A is the area. The resistance model predicts:

$$R_p = R_1 + R_2. \tag{2}$$

When the cross-sectional area is the same for both materials 1 and 2, equation (2) may be rewritten as:

$$\frac{l_1 + l_2}{P} = \frac{l_1}{P_1} + \frac{l_2}{P_2}. \tag{3}$$

For template 300A with cap layer 306 of $SiO_x$ with a thickness of about 10 nm and permeability $P_1$, template permeability may be adjusted by selecting porosity and pore size of the porous layer 302. The effect of the permeability and thickness of porous layer 302 on the effective permeability of a multi-layer composite imprinting stack with a thickness of 310 nm is shown in Table 2.

TABLE 2

| Cap Layer Thickness (SiO$_x$), Permeability P$_1$ | Porous Layer Thickness, Permeability P$_2$ | Base Layer Thickness (SiO$_2$), Permeability P$_1$ | Permeability Ratio | Effective Permeability of the Total Stack |
|---|---|---|---|---|
| 10 nm | 300 nm | 0 | P$_2$ = 1000 P$_1$ | 30.1 P$_1$ |
| 10 nm | 200 nm | 100 nm | P$_2$ = 1000 P$_1$ | 2.8 P$_1$ |
| 10 nm | 100 nm | 200 nm | P$_2$ = 1000 P$_1$ | 1.5 P$_1$ |
| 10 nm | 300 nm | 0 | P$_2$ = 100 P$_1$ | 23.8 P$_1$ |

Table 2 suggests that increasing a thickness of the porous layer alone may yield a higher effective permeability than increasing the permeability of the porous layer alone. That is, for a porous layer thickness of 300 nm and a cap layer thickness of 10 nm, a ten-fold increase in permeability of the porous layer from 100P$_1$ to 1000P$_1$ increases the effective permeability from 23.8P$_1$ to 30.1P$_1$. For composite imprinting stacks with a porous layer thickness of 100 nm, 200 nm, and 300 nm and a cap layer thickness of 10 nm, the effective permeability increases twenty-fold, from 1.5P$_1$ to 2.8P$_1$ to 30.1P$_1$, respectively, over the 200 nm increase in porous layer thickness.

In another embodiment, protrusions 310 may extend from cap layer 306. In an example, template 300B may be formed by depositing a 500 nm thick porous layer (e.g., an organosilicate low-k film) on a base layer (e.g., quartz), and growing a 100 nm thick cap layer (e.g., SiO$_x$) on top of the porous layer. The cap layer is etched back to form protrusions 90 nm in height. As used herein, a thickness of cap layer 306 is considered independently of the height of the protrusions 310. Thus, the cap layer in this example is considered to be 10 nm thick, with protrusions 90 nm in height extending from the cap layer. At least about 50% of the template surface has a 10 nm thick covering of SiO$_x$ (i.e., about 50% of the template surface area is covered with protrusions) with a 500 nm thick porous layer underneath. Helium may diffuse more quickly through portions of the cap layer from which there are no protrusions, achieving an overall increase in helium permeability at least partially dependent on the thickness of the porous layer, the thickness of the cap layer, and the fraction of the surface area of the template free from protrusions.

A template may be formed as a unitary structure with a porosity and average pore size selected to allow diffusion of a gas. Templates made from, for example, organic polymers, inorganic materials (e.g., silicon carbide, doped silica, VYCOR®), and the like, or any combination thereof, may have a lower packing density, and therefore a higher gas (e.g., helium) permeability, than vitreous fused silica. FIG. 3 illustrates template 300C. Template 300C consists essentially of a single porous layer 302. The porous layer 302 is not adhered to a base layer. The porous layer may have an average pore size of at least about 0.4 nm and a porosity of at least about 10%.

Template 300D includes porous layer 302 with a cap layer 306. Cap layer 306 may be, for example, SiO$_x$. As with template 300C, the porous layer is not adhered to a base layer. The cap layer 306 may inhibit penetration of the polymerizable material into the porous material. The cap layer 306 may also impart desirable surface properties, mechanical properties, and the like to the template.

An imprinting stack may include a substrate and a layer adhered to the substrate. Multi-layer imprinting stacks may include one or more additional layers adhered together to form a multi-layer composite. The substrate may be, for example, a silicon wafer. A layer adhered to the substrate may include, for example, organic polymeric material, inorganic polymeric material, or any combination thereof. Pore size and porosity of the substrate, the layers, or any combination thereof may be selected to allow diffusion of a gas through the imprinting stack, thus facilitating reduction of trapped gases and filling of features in the template during an imprint lithography process.

Figure 4:
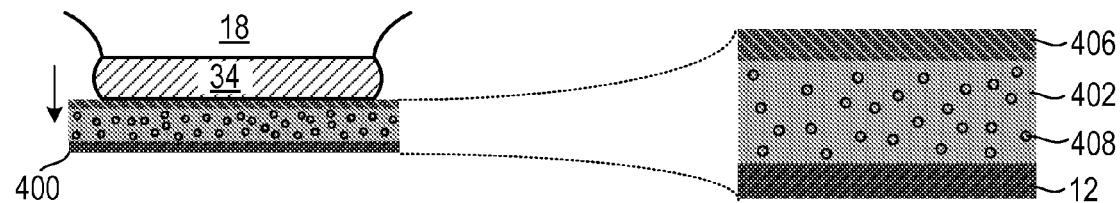
FIG. 4 illustrates a porous imprinting stack.

FIG. 4 illustrates polymerizable material 34 between template 18 and imprinting stack 400. The arrow indicates the direction of gas transport into the imprinting stack. In some cases, gas permeability of the imprinting stack 400 may be increased by increasing a thickness of the imprinting stack. In some embodiments, increasing a thickness of the imprinting stack may improve the gas absorption capacity of the stack, and reduce the probability of gas saturation during a purge.

In certain embodiments, as depicted in the enlarged cross-sectional view of imprinting stack 400, the imprinting stack may include a porous layer 402 formed on substrate 12. Porous layer 402 may have pores 408 and may be, for example, an organosilicate low-k film. Cap layer 406 may be formed on porous layer 402. A thickness of porous layer 402 may be in a range of about 50 nm to a few µm, depending on the intended use. Pore size in the porous layer may be well-controlled (e.g., substantially uniform or with a known distribution).

In some embodiments, a pore size or average pore size of porous layer 402 is less than about 10 nm, less than about 3 nm, or less than about 1 nm. In some cases, the pore size or average pore size is at least about 0.4 nm, at least about 0.5 nm, or larger. That is, the pore size or average pore size may be large enough to provide a sufficient number of solubility sites for a gas (e.g., helium), such that gas trapped between the substrate 12 and a template 18 may diffuse into porous layer 402 of the imprinting stack 400. In some embodiments, a porosity of porous layer 402 is at least 10% or at least 20%.

In some cases, strain from the base layer of a porous template or from the substrate of a porous imprinting stack may be transferred through the porous layer to the cap layer. The porous layer may have a lower Young's modulus than the base layer or substrate. In certain embodiments, transfer of the strain may be reduced by embedding porous material in the substrate. For example, a multiplicity of recesses or grooves may be etched into a substrate or base layer, porous material may be deposited in the recesses or grooves. In some cases, the porous material may substantially fill the recesses or grooves. Then, a cap layer may be deposited on the base layer or substrate to substantially cover the base layer or substrate and the porous material, such that the cap layer is in contact with the base layer or substrate, and strain transfer is reduced. The area and spacing of the recesses or grooves, and the volume of the porous material may be sufficient to allow gas to escape into the porous material during an imprint lithography process.

Figure 5:
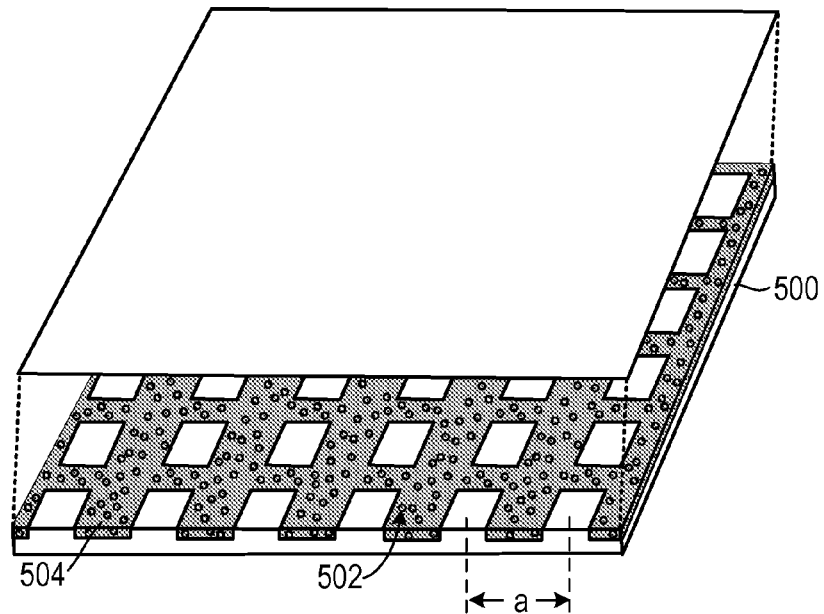
FIG. 5 illustrates a portion of a layer with porous material in a multiplicity of recesses.

FIG. 5 illustrates an exploded perspective view of layer 500 with recesses 502. Layer 500 may be, for example, a substrate. Recesses 502 may include, for example, grooves or depressions of any regular or irregular, uniform or non-uniform shape or size. In some embodiments, recesses 502 may form a grid pattern with uniform or non-uniform spacings. Grid spacing a may be, for example, about 0.25 µm. Recesses 502 may be substantially filled with porous material 504. A cap layer 506 may be formed over layer 500 and porous material 504 in recesses 502, such that strain may be transferred directly from the layer 500 to the cap layer 506, while still allowing increased diffusion of gas through the template 500. The cap layer 506 may be formed by methods including, for example, chemical vapor deposition and the like.

For an imprint lithography process with a porous template, the time required for drops of a polymerizable material to form a substantially continuous layer between the imprinting stack/substrate and the template may be at most about 80%, at most about 50%, or at most about 20%, of the time required for the same arrangement of drops of the same polymerizable material to form a substantially continuous layer between a similar imprinting stack/substrate and a second template when the second template is less porous, or has a lower porosity, than the porous template (e.g., when the second template is made of fused silica, quartz, or common template material). For an imprint lithography process with a porous imprinting stack/substrate, the time required for drops of a polymerizable material to form a substantially continuous layer between the imprinting stack/substrate and the template may be at most about 80%, at most about 50%, or at most about 20%, of the time required for the same arrangement of drops of the same polymerizable material to form a substantially continuous layer between a second imprinting stack/substrate and a similar template when the second imprinting stack/substrate is less porous, or has a lower porosity, than the porous imprinting stack/substrate (e.g., when the second imprinting stack consists essentially of an adhesion layer on a silicon wafer).

Figure 6:
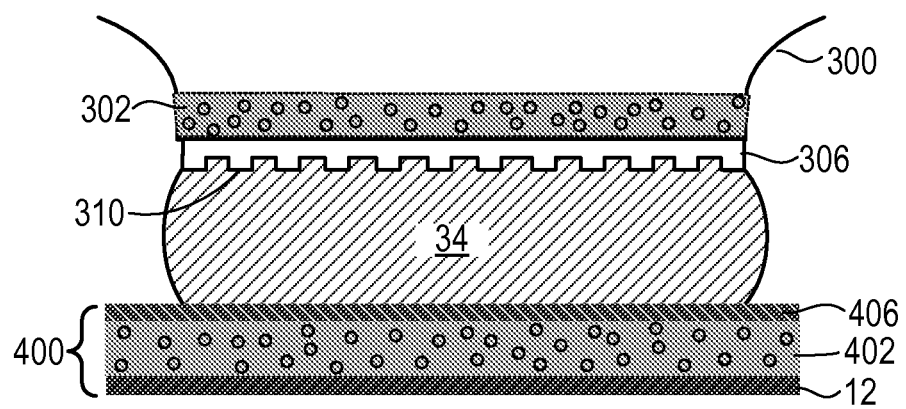
FIG. 6 illustrates an imprint lithography process using a porous template and a porous imprinting stack.
Figure 7:
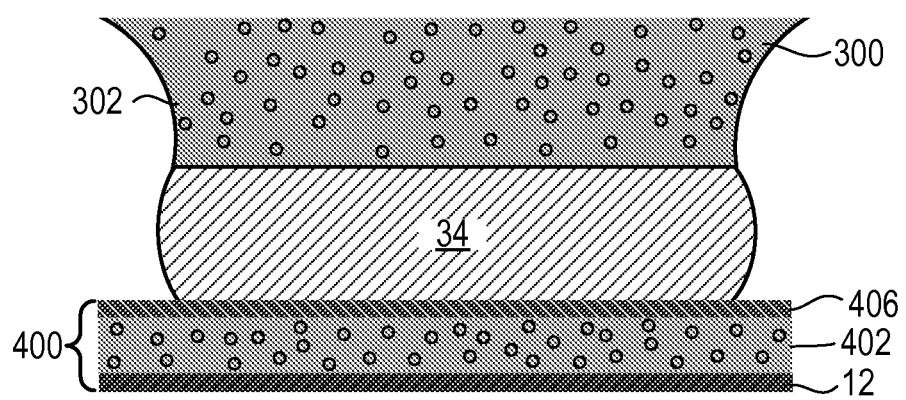
FIG. 7 illustrates an imprint lithography process using a unitary porous template and a porous imprinting stack.

In some embodiments, as illustrated in FIG. 6, a porous template and a porous imprinting stack may be used together. For example, a porous layer 302 may be included in the template 300, and porous layer 402 may be included in the imprinting stack 400. Introducing a porous layer in both the template and the imprinting stack may allow an increased amount of gas (e.g., helium, nitrogen, oxygen, etc.) to escape through the porous layers if, for example, the cap layers are sufficiently thin. In some embodiments, as illustrated in FIG. 7, a unitary porous template 300 and an imprinting stack with a porous layer may be used together.

EXAMPLES

Porous Imprinting Stack Preparation

SOG (Spin-On-Glass, ACCUGLASS® 512B, available from Honeywell Electronic Materials) was spun onto precleaned 8-inch double side polished silicon wafer substrate. The wafer was then baked at 80° C., 150° C. and 250° C., respectively, for 60-120 seconds at each temperature. The SOG-coated wafer was then cured at 425° C.-450° C. in a nitrogen environment for 1 hour. The SOG layer was about 1.7 µm thick. The resulting hydrophobic SOG surface was treated with oxygen plasma for 5-20 seconds to generate a hydrophilic surface.

An adhesion layer was formed on the SOG surface from a composition including approximately 77 grams of IsoRad 501 (a multi-functional reactive compound available from Schenectady International, Inc. in Schenectady, N.Y.), 22 grams of Cymel 303ULF (a cross-linking agent including hexamethoxymethyl-melamine (HMMM), available from Cytec Industries, Inc. of West Patterson, N.J.) and 1 gram of Cycat 4040 (a catalyst available from Cytec Industries, Inc.), and approximately 39.9 kilograms of PM Acetate (a solvent including 2-(1-methoxy) propyl acetate, available from Eastman Chemical Company, Kingsport, Tenn.). The composition was spun on the SOG layer and cured at 160° C. for 60 seconds to form an adhesion layer with a thickness of about 7 nm.

Porous Template Preparation

SOG (Spin-On-Glass, ACCUGLASS® 512B, by Honeywell Electronic Materials) was spun onto a pre-cleaned fused silica template. The template was then baked at 80° C., 150° C. and 250° C., respectively, for 60-120 seconds at each temperature. The SOG-coated template was then cured at 425° C.-450° C. in a nitrogen environment for 1 hour. The SOG layer was about 650 µm thick. The template was cleaned with standard wet cleaning process. Then a silicon oxide cap layer was deposited using plasma-enhanced chemical vapor deposition (PEVCD). The cap layer was about 8 nm thick.

Figure 8:
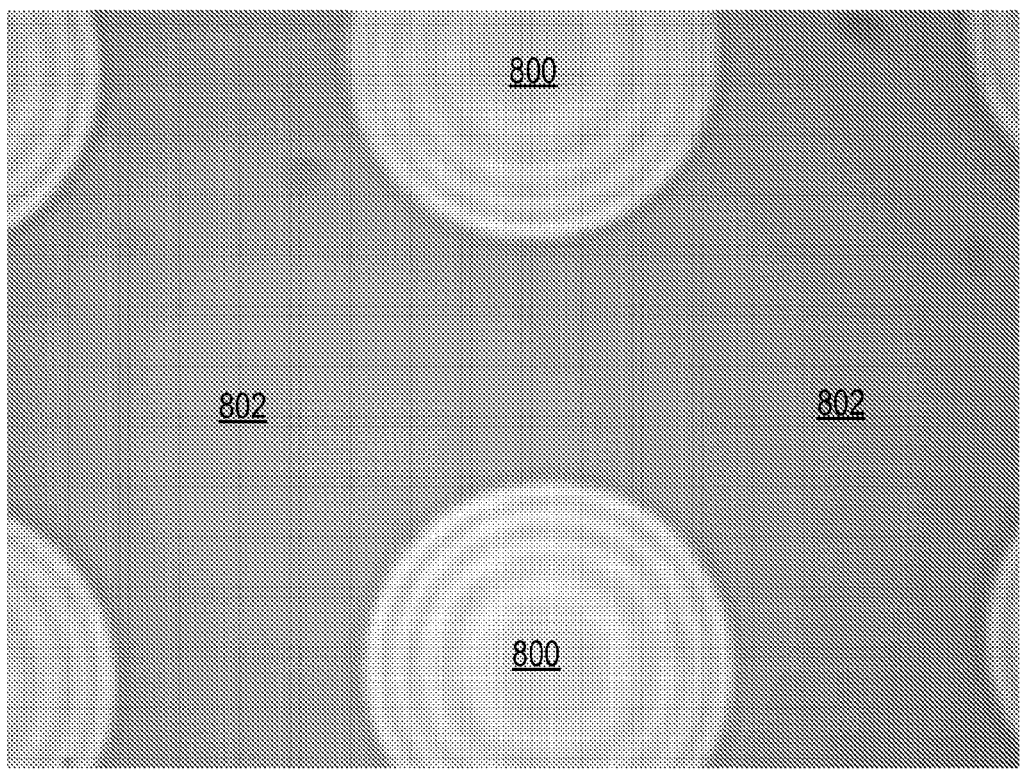
FIG. 8. is a photograph of drops of imprint resist as dispensed on a substrate.

Imprint resists similar to bulk material A8 (e.g., viscosity about 10 cP) in U.S. Pat. No. 7,307,118, which is hereby incorporated by reference herein, were used to test filling speeds for porous imprinting stacks made as described above. The imprint resist was dispensed in a grid pattern on the imprinting stack as shown in FIG. 8, with drops 800 of imprint resist spaced 340 µm center-to-center and a drop volume of about 12 pL. Interstitial regions 802 are visible between drops 800. A helium purge was performed to substantially replace air between the imprinting stack and the template with helium. The residual layer thickness of the solidified resist was about 90 nm in each case.

Comparative Example

Figure 9A:
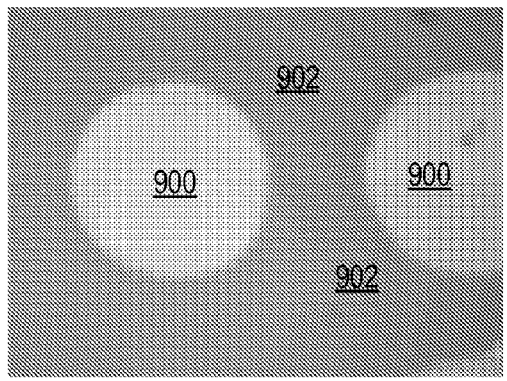
FIGS. 9A-D are photographs of drops of imprint resist spreading on an imprinting stack.
Figure 9B:
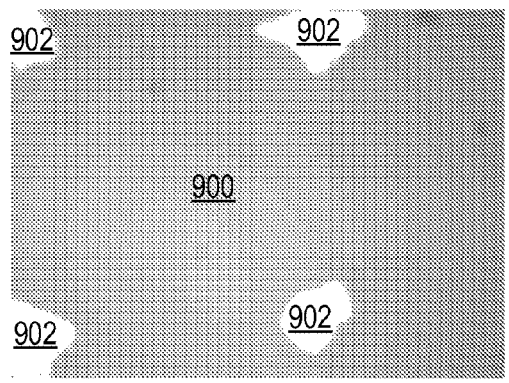
Figure 9C:
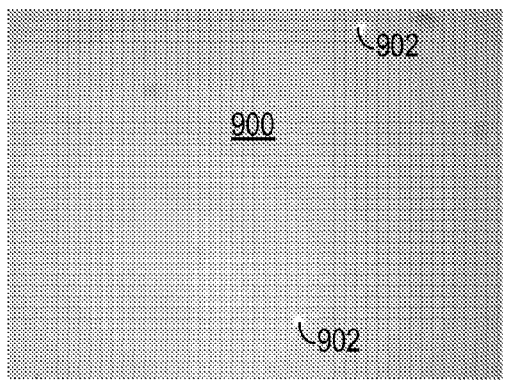
Figure 9D:
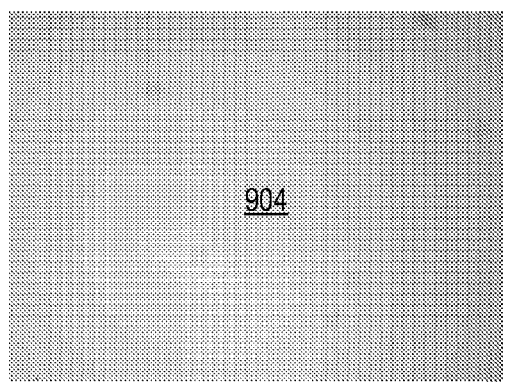

Spreading of imprint resist without porous imprinting stack and with blank fused silica template. FIG. 9A is a photograph of drops 900 of imprint resist between an imprinting stack and a blank fused silica template at the time the template contacts the imprint resist. Interstitial regions 902 cover more surface area than the drops 900. FIG. 9B is a photograph taken 1 second after contact of the imprint resist with the template. The field of view of the camera has been adjusted such that four interstitial regions 902 are visible. FIG. 9C is a photograph taken 7 seconds after contact of the imprint resist with the template. Two interstitial regions 902 are visible. FIG. 9D shows complete spreading of the imprint resist to form a substantially continuous layer 904 between the template and the imprinting stack 8 seconds after the template contacted the imprint resist.

Example

Figure 10A:
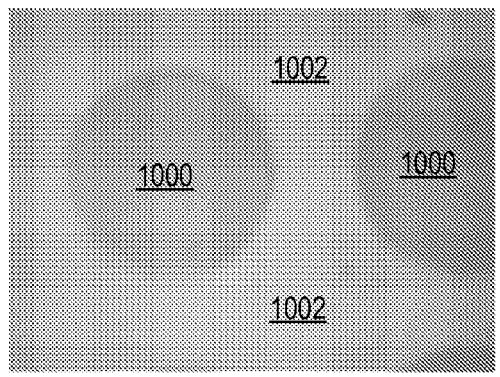
FIGS. 10A-D are photographs of drops of imprint resist spreading on a porous imprinting stack.
Figure 10B:
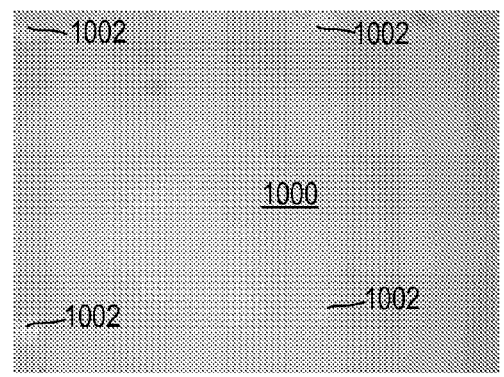
Figure 10C:
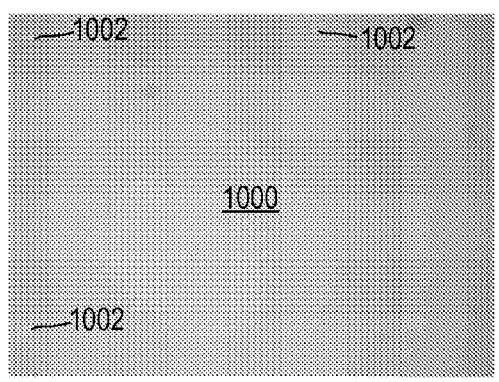
Figure 10D:
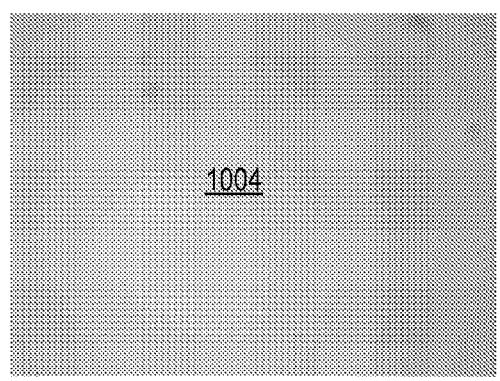

Spreading of imprint resist with porous imprinting stack and with blank fused silica template. FIG. 10A is a photograph of drops 1000 of imprint resist between a porous imprinting stack and a blank fused silica template at the time the template contacts the imprint resist. The porous imprinting stack includes a silicon wafer coated with a SOG layer with a thickness of about 1.7 µm, and an 8 nm adhesion layer over the SOG layer, as described above. FIG. 10B is a photograph taken 0.5 seconds after contact of the imprint resist with the template. The field of view of the camera has been adjusted such that four interstitial regions 1002 are visible. FIG. 10C is a photograph taken 0.75 seconds after contact of the imprint resist with the template. Three interstitial regions 1002 are visible. FIG. 10D shows complete spreading of the imprint resist to form a substantially continuous layer 1004 between the template and the porous imprinting stack 1.1 seconds after the template contacted the imprint resist.

Thus, comparison of time required for spreading of the imprint resist to achieve complete filling or to form a substantially continuous layer (i.e., no visible trapped gas or interstitial regions) between a blank fused silica template and an imprinting stack reveals a dramatic reduction in filling time for the porous imprinting stack relative to the conventional imprinting stack. In this case, the time to achieve complete filling is reduced over 75%. Thus, the spreading of the imprint resist to form the substantially continuous layer on an imprinting stack with a porous material occurs in less than about 20% of the time required for the imprint resist to form a substantially continuous layer on an imprinting stack without a porous material. Similar increases in filling speed may be achieved for porous templates in comparison with templates without a porous material. This reduction in filling time allows more rapid throughput and reduce the probability of defects in imprint lithography processes.

The embodiments of the present invention described above are exemplary. Changes and modifications may be made to the disclosure recited above, while remaining within the scope of the invention.

What is claimed is:

1. An imprint lithography template comprising a porous material defining a multiplicity of pores with an average pore size of less than about 1 nm, wherein:
   the porous material is positioned between a base layer and a cap layer,
   the base layer comprises recesses and the porous material is positioned in the recesses, and
   a porosity of the porous material is at least about 10%.

2. The template of claim 1, wherein the average pore size is greater than the kinetic diameter of helium (0.256 nm).

3. The template of claim 1, wherein the average pore size is larger than a pore size of fused silica.

4. The template of claim 1, wherein the porosity of the porous material is at least about 20%.

5. The template of claim 1, wherein the porous material is an organosilicate low-k material.

6. The template of claim 5, wherein a relative porosity of the porous material with respect to fused silica is at least about 20%.

7. The template of claim 1, wherein the porous material has a Young's modulus of at least about 2 GPa.

8. The template of claim 1, wherein the base layer comprises fused silica.

9. The template of claim 1, wherein the cap layer comprises $SiO_x$, wherein $1 \leq x \leq 2$.

10. The template of claim 1, wherein a thickness of the cap layer is less than about 100 nm.

11. The template of claim 10, wherein a thickness of the cap layer is less than about 50 nm.

12. The template of claim 11, wherein a thickness of the cap layer is less than about 20 nm.

13. The template of claim 1, wherein the cap layer forms a continuous layer over the porous material and comprises a patterned exterior surface.

14. An imprint lithography template comprising a porous material defining a multiplicity of pores with a pore size of less than 1 nm, wherein:
   the porous material is positioned between a base layer and a cap layer,
   wherein the cap layer forms a continuous layer over the porous material and comprises a patterned exterior surface, and
   a porosity of the porous material is in a range of 5% to 45%.

15. The imprint lithography template of claim 14, wherein the cap layer comprises $SiO_2$.

16. The imprint lithography template of claim 14, wherein a thickness of the cap layer is about 10 nm.

17. An imprint lithography template comprising a porous material defining a multiplicity of pores with a pore size of less than 1 nm, wherein:
   the porous material is positioned between a base layer and a cap layer,
   the cap layer comprises $SiO_2$, and
   a porosity of the porous material is in a range of 5% to 45%.

18. The imprint lithography template of claim 17, wherein the cap layer forms a continuous layer over the porous material and comprises a patterned exterior surface.

19. The imprint lithography template of claim 17, wherein a thickness of the cap layer is about 10 nm.

20. The imprint lithography template of claim 17, wherein the base layer comprises fused silica.

* * * * *